US010824254B1

(12) United States Patent
Bikumala et al.

(10) Patent No.: US 10,824,254 B1
(45) Date of Patent: Nov. 3, 2020

(54) USING HEAT TO CHARGE A STYLUS OF A COMPUTING DEVICE

(71) Applicant: Dell Products L. P., Round Rock, TX (US)

(72) Inventors: Sathish Kumar Bikumala, Round Rock, TX (US); Jace W. Files, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/554,690

(22) Filed: Aug. 29, 2019

(51) Int. Cl.
| | |
|---|---|
| *G06F 3/0354* | (2013.01) |
| *G06F 3/038* | (2013.01) |
| *H01L 35/30* | (2006.01) |
| *H01L 35/32* | (2006.01) |
| *G06F 1/20* | (2006.01) |
| *H05K 7/20* | (2006.01) |
| *G06F 1/16* | (2006.01) |
| *H02J 7/00* | (2006.01) |

(52) U.S. Cl.
CPC ............ *G06F 3/038* (2013.01); *G06F 1/1656* (2013.01); *G06F 1/203* (2013.01); *H01L 35/30* (2013.01); *H01L 35/32* (2013.01); *H02J 7/00* (2013.01); *H05K 7/20145* (2013.01); *H05K 7/20154* (2013.01); *G06F 2200/1632* (2013.01); *H02J 2207/20* (2020.01)

(58) Field of Classification Search
CPC ....... G06F 3/03545; G06F 2203/04108; G06F 2203/04101; H02J 5/005
See application file for complete search history.

(56) References Cited

U.S. PATENT DOCUMENTS

| | | | | |
|---|---|---|---|---|
| 9,507,381 | B1 * | 11/2016 | Vanderet | G06F 1/1684 |
| 2009/0201639 | A1 * | 8/2009 | Wang | G06F 1/203 361/679.54 |
| 2013/0141399 | A1 * | 6/2013 | Cho | G06F 3/046 345/179 |
| 2017/0184863 | A1 * | 6/2017 | Balachandreswaran | G02B 27/0176 |

* cited by examiner

*Primary Examiner* — Ram A Mistry
(74) *Attorney, Agent, or Firm* — Campbell Stephenson LLP; Shiv S. Naimpally

(57) ABSTRACT

In some examples, a computing device may convert thermal energy to electricity. The computing device may include a stylus holder located on an edge of the enclosure and may be associated with a stylus detachably stored in the stylus holder. The stylus holder may be configured to hold a stylus when the stylus is not in use. The stylus may include one or more rechargeable batteries and one or more thermocouples to generate electricity to charge the one or more rechargeable batteries. The thermocouples may generate the electricity based on a temperature difference between a first location of the stylus that is heated to a first temperature by a user's body part (e.g., fingers) in contact with the stylus at the first location and a second location of the stylus that is at a second temperature that is lower than the first temperature.

20 Claims, 6 Drawing Sheets

US 10,824,254 B1

USING HEAT TO CHARGE A STYLUS OF A COMPUTING DEVICE

BACKGROUND OF THE INVENTION

Field of the Invention

This invention relates generally to electronic devices, such as computing devices with touch sensitive display devices that accept input using a stylus, and more particularly, to using heat generated by the device and/or body heat generated by a user holding the stylus to charge the batteries of the stylus.

Description of the Related Art

As the value and use of information continues to increase, individuals and businesses seek additional ways to process and store information. One option available to users is information handling systems (IHS). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Modern information handling systems include many different types of consumer and commercial electronic devices such as, for example, personal computers (e.g., desktops or laptops), tablet computers, mobile devices (e.g., personal digital assistants (PDAs) or smart phones), User Equipments (UEs), corporate (or small business) server and data processing systems, and the like. These devices may vary in size, shape, performance, functionality, and price. In addition to supporting data processing and computing functionalities, almost all of these modern devices also offer wireless communication capabilities for voice, picture, video, and/or other data communication.

A touchscreen computing device, such as a tablet or a two-in-one device, may receive input from a stylus (also referred to as an "active pen"), which includes electronic components and allows users to write directly onto the touch-screen surface of a display associated with the computing device. The stylus may be used for digital note-taking, electronic document annotation, on-screen digital drawing or painting, as well as for accurate object selection and scrolling. When used in conjunction with handwriting recognition software, the stylus's handwritten input can be converted to digital searchable text, stored in a digital document, and edited in a text or drawing application.

Current available styluses typically use (i) non-chargeable batteries that last from about six to nine months on one battery for a typical user or (ii) rechargeable batteries that must be removed and placed in a charger to charge the batteries. When the stylus stops working, the users may not understand why their pen stopped working (at least initially), and this may create a bad user experience. In addition, the effort to remove and recharge the batteries may cause the user frustration.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

For example, a computing device with an associated stylus may convert thermal energy to electricity. The computing device may include an enclosure that includes a plurality of components, such as one or more processors, memory, and the like. The computing device may include a stylus holder located on an edge of the enclosure and a stylus detachably stored in the stylus holder. The stylus holder may be configured to hold a stylus when the stylus is not in use. The stylus may include one or more rechargeable batteries and a thermoelectric generator, such as one or more thermocouples, to generate electricity to charge the one or more rechargeable batteries. The thermocouples may generate the electricity based on a temperature difference between a first location of the stylus and a second location of the stylus. The first location of the stylus may be heated to a first temperature by a user's body part (e.g., fingers) in contact with the stylus at the first location. The second location of the stylus may be at a second temperature lower than the first temperature.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
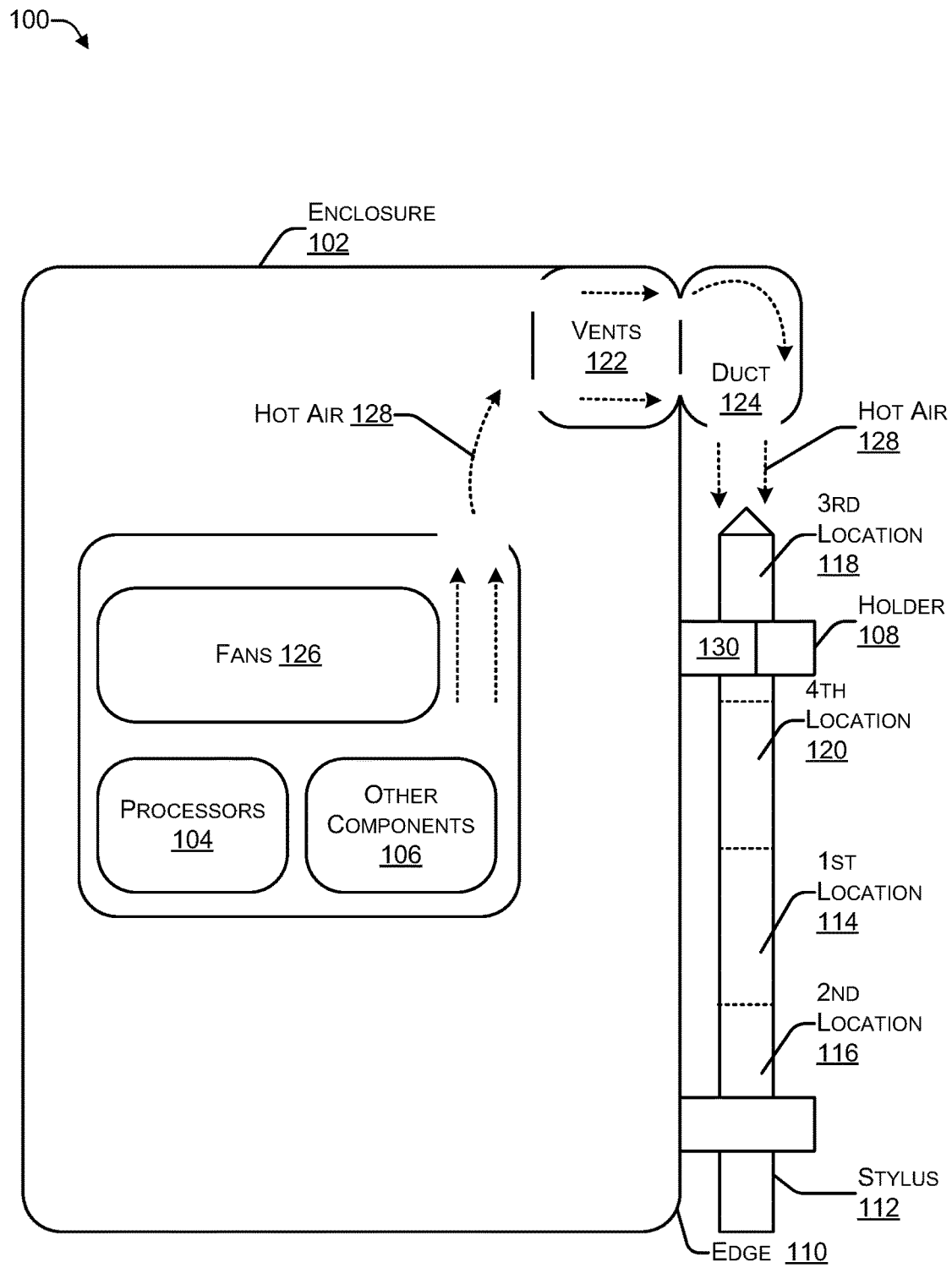
FIG. 1 is a block diagram of a system that includes a computing device having an external holder and directing hot air towards a stylus placed in the external holder, according to some embodiments.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques described herein may enable a stylus associated with a computing device to convert thermal energy ("heat" or "hot air") to electricity and use the electricity to charge rechargeable batteries that power the stylus. For example, the stylus may generate electricity using heat emanating from a user's hand and/or fingers when the user is holding the stylus. Additionally or alternatively, the stylus may generate electricity using heat generated from heat-generating components located in an enclosure of the computing device when the stylus is not in use. For example, when the stylus is placed in (and held by) a stylus holder located either inside or outside an enclosure of the computing device, the heat generated by the heat-generating components may be directed towards the stylus to enable the stylus to generate energy to recharge the batteries of the stylus.

As a first example, a computing device may include an enclosure that include a plurality of components such as one or more processors and one or more non-transitory computer-readable storage media to store instructions executable by the one or more processors. The computing device may further include a stylus holder located on an edge of the enclosure. For example, the stylus holder may be used to hold a stylus when the stylus is not in use. The computing device may be associated with a stylus detachably stored in the stylus holder. For example, the stylus may include one or more rechargeable batteries and one or more thermocouples to generate electricity to charge the one or more rechargeable batteries. When the stylus is being used, the one or more thermocouples may generate the electricity based on a temperature difference between a first location of the stylus that is heated to a first temperature by a user's fingers holding the stylus at the first location and a second location of the stylus that is at a second temperature that is lower than the first temperature.

As used herein, a thermocouple refers to an electrical device including two dissimilar electrical conductors or semiconductors forming electrical junctions at differing temperatures. A thermocouple may produce a temperature-dependent voltage as a result of the thermoelectric effect, and this voltage may be used to recharge one or more rechargeable batteries as described herein.

For example, the plurality of components in the enclosure may generate heat to increase a temperature of air inside the enclosure to create hot air. For example, the enclosure may also include components that may aid in heat transfer, such as a vent located on the edge of the enclosure that is connected to the stylus holder. The vent may enable the hot air to exit the enclosure. The enclosure may further include a duct detachably placed adjacent to the vent to direct the hot air towards the stylus when the stylus is placed in the stylus holder to cause the stylus to generate the electricity to charge the one or more rechargeable batteries. In further examples, the enclosure may also include a fan to direct the hot air towards the vent. In some cases, the enclosure may include a heat sink that is attached to or adjacent to at least one component of the plurality of components. In some cases, one edge of the heat sink may be positioned within a predetermined distance from the vent to aid heat transfer. As used herein, a heat sink is a device that transfers thermal energy from heat-generating components (such as processors, memory, graphics processing unit (GPU), digital signal processor (DSP), drive (e.g., hard drive, solid state drive (SSD), etc.) to a lower temperature fluid medium (such as air).

The stylus may include one or more thermocouples to generate electricity when the stylus is stored in the stylus holder. The stylus may include a third location that is heated to a third temperature by the hot air exiting from the enclosure of the computing device and a fourth location that is at a fourth temperature that is lower than the third temperature. The thermocouples may be included in a thermoelectric generator. The thermocouples may be configured to generate the electricity when the stylus is stored in the stylus holder based on a temperature difference between the third temperature and the fourth temperature. The thermoelectric generator may be configured to be coupled to a battery charger to charge the one or more rechargeable batteries.

In a second example, a computing device may include an enclosure that may include a plurality of components such as one or more processors and one or more non-transitory computer-readable storage media to store instructions executable by the one or more processors, a stylus holder located inside the enclosure, and a stylus detachably stored in the stylus holder. The stylus holder may be configured to hold a stylus when the stylus is not in use. The stylus may include one or more rechargeable batteries and one or more thermocouples to generate electricity to charge the one or more rechargeable batteries. In some cases, the thermocouples may be configured to generate the electricity when the stylus is being used based on a temperature difference between a first location of the stylus that are heated to a first temperature by a user's fingers holding the stylus at the first location and a second location of the stylus that is at a second temperature that is lower than the first temperature.

The plurality of components may generate heat to increase a temperature of air inside the enclosure to create hot air. For example, the enclosure may include components that may aid heat transfer, such as a heat sink that is attached to at least one component of the plurality of components. For example, one edge of the heat sink may be positioned within a predetermined distance from the stylus holder. In further cases, the enclosure may also include a fan to direct the hot air towards the stylus holder.

The stylus may include one or more thermocouples to generate electricity when the stylus is stored in the stylus holder. The stylus may include a third location that is heated to a third temperature by the hot air exiting from the enclosure of the computing device a fourth location that is at a fourth temperature that is lower than the third temperature. The thermocouples may be included in thermoelectric generator. The thermocouples may be configured to generate the electricity when the stylus is stored in the stylus holder based on a temperature difference between the third temperature and the fourth temperature. The thermoelectric generator may be configured to be coupled to a battery charger to charge the one or more rechargeable batteries.

The system and techniques described herein may generate electricity based on a temperature difference (i) between a first location of the stylus that is heated to a first temperature by a user's fingers holding the stylus at the first location and a second location of the stylus that is at a second temperature that is lower than the first temperature; or (2) between a third location that is heated to a third temperature by the hot air exiting from the enclosure of the computing device and a fourth location that is at a fourth temperature that is lower than the third temperature. For example, the systems and techniques may include a computer device having an enclosure that includes a plurality of components (such as processors (e.g., CPU), memory, graphics processing unit (GPU), digital signal processor (DSP), drive (e.g., hard drive, solid state drive (SSD), etc.)), network interface, power supply, and the like), a stylus holder to hold a stylus when the stylus is not in use, and a stylus detachably stored in the stylus holder. The stylus holder may be located outside the enclosure or inside the enclosure.

The stylus may include one or more rechargeable batteries and one or more thermocouples to generate electricity to charge the one or more rechargeable batteries. The systems and techniques described herein may further include generating the electricity via the thermocouples when the stylus is being used based on a temperature difference between a first location of the stylus that is heated to a first temperature by a user's fingers holding the stylus at the first location and a second location of the stylus that is at a second temperature that is lower than the first temperature.

The plurality of components may generate heat to increase a temperature of air inside the enclosure to create hot air. For example, the enclosure may include components that may aid heat transfer, such as a vent located on the edge of the enclosure that is connected to the stylus holder, the vent enabling the hot air to exit the enclosure. The enclosure may further include a duct detachably placed adjacent to the vent to direct the hot air towards the stylus when the stylus is placed in the stylus holder to cause the stylus to generate the electricity to charge the one or more rechargeable batteries. For example, the enclosure may also include a fan to direct the hot air towards the vent. The enclosure may also include a heat sink that is attached to at least one component of the plurality of components. For example, one edge of the heat sink may be positioned within a predetermined distance from the vent.

In additional and alternative cases, the enclosure may include a heat sink that is attached to at least one component of the plurality of components and transfer heat to a stylus holder inside the enclosure, for example, inside an internal cavity of the enclosure. For example, one edge of the heat sink may be positioned within a predetermined distance from the stylus holder. In further cases, the enclosure may also include a fan to direct the hot air towards the stylus holder.

The stylus may include one or more thermocouples to generate electricity when the stylus is stored in the stylus holder. The stylus may include a third location that is heated to a third temperature by the hot air exiting from the enclosure of the computing device and a fourth location that is at a fourth temperature that is lower than the third temperature. The thermocouples may be included in a thermoelectric generator. The thermocouples may be configured to generate the electricity when the stylus is stored in the stylus holder based on a temperature difference between the third temperature and the fourth temperature. The thermoelectric generator may be configured to be coupled to a battery charger to charge the one or more rechargeable batteries.

FIG. 1 is a block diagram of a system that includes a computing device having an external holder and directing hot air towards a stylus placed in the external holder, according to some embodiments. As illustrated in FIG. 1, the computing device 100 may include an enclosure 102 that may include a plurality of components, such as one or more processors 104 (e.g., Central Processing unit (CPU)) and other heat-generating components 106. Other heat-generating components 106 may include, but not be limited to, one or more non-transitory computer-readable storage media (e.g., random-access memory (RAM)), graphics processing units (GPU), digital signal processors (DSP), drives (e.g., hard drives, solid state drives (SSD), and other similar devices. The computer-readable storage media may be configured to store instructions executable by the one or more processors 104.

The computing device 100 may include a stylus holder 108 located on an edge 110 of the computing device 100. The stylus holder 108 may hold a stylus 112 when the stylus 112 is not in use. The stylus holder 108 may be a physical sleeve (as illustrated in FIG. 1), magnets (e.g., magnets having a first polarity facing out from the stylus and magnets having a second opposite polarity located on the edge 110 of the enclosure), Velcro® (i.e., a hoop and loop, with the stylus having a loop surface and an edge of enclosure having a hook surface), or any variations or combinations thereof.

For example, the stylus holder 108 may include a fastener that is configured to allow the stylus holder 108 to hold the stylus 112 in a fixed position when the stylus is positioned in the fastener. For example, the fastener may include a flexible pen clip, a C-shaped clip, or any similar fastening elements. For example, the fastener may include a magnet to attach the stylus 112 through magnetic forces or other suitable methods. The stylus holder 108 may further include a connector 130 that is configured to allow the stylus holder 108 to be connected to the computing device 100. The fastener and the connector may form an integral stylus holder or may be separate parts that are connected to form the stylus holder 108.

The stylus 112 may be a pen-shaped tool configured to provide user input on a touch-based electronic device such as the computing device 100. The stylus 112 may include one or more thermocouples that may be used to generate electricity to charge rechargeable batteries that power the stylus 112. The one or more thermocouples may generate electricity based on a temperature difference between two different portions of the stylus 112. For example, the stylus 112 may have a body that is made of at least two metals (the term metal as used herein refers to a pure metal or a metal alloy), with a first portion including a first metal alloy and a second portion including a second metal alloy. The metal (or metal alloy) portion of the stylus 112 may be attached together using a plastic or a third metal (or metal alloy). In this way, the two different metals may be used as a thermocouple.

The stylus 112 may be stored in the stylus holder 108 when not in use, for example, using magnetic forces or other suitable methods. For example, the stylus 112 may have one or more magnets located in a barrel of the stylus 112 and the stylus holder 108 may have one or magnets having an opposite polarity to enable the stylus holder 108 to hold the stylus 112 in place using magnetic attraction of opposite polarities.

As illustrated in FIG. 1, the stylus 112 may generate electricity using thermocouples based on a temperature differential between (a) an ambient temperature of air around the enclosure 102 and (b) hot air 128 exiting from the computing device 100 when the stylus 112 is stored in the stylus holder 108 outside the enclosure 102. For example, multiple components inside the enclosure 102 of the computing device 100 may generate hot air 128. The enclosure 102 may include a vent 122 located on the edge 110 of the enclosure 102. The duct 124 may cause hot air 128 from the enclosure 102 to exit the enclosure 102 and heat up a third location 118 on the stylus 112. The vent 122 may include one or more holes (or another type of opening) on the edge 110 of the enclosure 102 to redirect the hot air 128 exiting the enclosure 102 towards the third location 118 of the stylus 112.

The stylus 112 may use electricity generated by the temperature differential between the hot air 128 and air surrounding other locations of the stylus 112 to recharge one or more rechargeable batteries. The stylus 112 may generate electricity when the stylus 112 is being held by a user (as further described in FIG. 2) based on a temperature difference between a first location 114 of the stylus and a second location 116 of the stylus 112. The first location 114 may make contact with a user appendage (e.g., one or more fingers used to grasp the stylus 112) causing the first location 114 to be heated to a first temperature. For example, the user may hold the stylus 112 with one or more of the user's fingers touching the first location 114 of the stylus 112 to increase a heat of the first location 114. The first location 114 may be a first portion of an outer surface of the stylus 112. The first portion of the outer surface may be positioned to be in touch with the user's fingers when the user is grasping the stylus 112. The first temperature at the first location 114 may be heated close to body temperature, such as 36.5-37.5° C., when the user is in touch with the stylus 112. The second location 116 may have a second temperature that is lower than the first temperature because the second location 116 is not in touch with a heat source (e.g., user appendage). For example, the second temperature may be an ambient temperature, such as 18, 19, 20, 21, 22, 23, 24, 25, 26° C. or any temperature value or range derived therefrom. The second location 116 may be exposed to the ambient environment or use a cooling channel to cool the second location 116 to have the second temperature.

The stylus 112 may generate electricity when the stylus 112 is being stored in the stylus holder 108 outside the enclosure 102. For example, the stylus 112 may generate electricity based on a temperature difference between a third location 118 and a fourth location 120 of the stylus 112. The temperature difference may be between about 5, 6, 7, 8, 9, 10, 11, 12, 13, 14, 15, 16, 17, 18, 19, 20, 21, 22, 23, 24, 25, 26, 27, 28, 29, 30° C. or any values or ranges derived therefrom. For example, when the stylus 112 is stored in the stylus holder 108 (e.g., outside the enclosure 102), the third location 118 of the stylus 112 may be heated to a third temperature by the hot air 128 generated from the plurality of components inside the enclosure 102 of the computing device 100 and directed towards the third location 118 by the vents 122, the duct 124, or both. The fourth location 120 may have a fourth temperature that is lower than the third temperature at the third location 118 because the fourth location 120 is exposed to the ambient temperature of the ambient environment. In some cases, the fourth location 120 may overlap or include the second location 116. The stylus 112 may generate electricity based on the temperature differential between the third location 118 that is in contact with the hot air 128 and one or more of the remaining locations 120, 114, 116. The stylus 112 may store the electricity by charging one or more rechargeable batteries when the stylus 112 is being held in the stylus holder 108.

Some of the plurality of components of the computing device 100, such as the processors 104 and other heat-generating components 106, may generate the hot air 128 when the computing device 100 is being used. Other heat-generating components 106 may include, but not be limited to, one or more non-transitory computer-readable storage media (e.g., random-access memory (RAM)), graphics processing unit (GPU), digital signal processor (DSP), drive (e.g., hard drive, solid state drive (SSD) or the like), voltage regulator, and other components. Additional components of the plurality of components of the computing device 100 may include one or more graphics process units (GPU), input/output (I/O) ports, sensors, keyboards, touchpad, trackballs, speakers, microphones, Wi-Fi antenna, Bluetooth antenna, Zigbee Antenna, cellular antenna, and the like.

The third location 118 of the stylus 112 may be adjacent to the vent 122 and may be heated to a third temperature when the stylus 112 is placed in the stylus holder 108 outside the enclosure 102. For example, the third temperature at the third location 118 of the stylus 112 may be higher than the second temperature at the second location 116 of the stylus 112 and the first temperature at the first location 114 of the stylus 112. The second temperature at the second location 116 of the stylus 112 may be at a room temperature or a temperature of an ambient environment. The first temperature at the first location 114 of the stylus 112 may be heated to a user's body temperature when a user's fingers are in contact with the first location 114.

The enclosure 102 may include a duct 124. The duct 124 may be configured to be detachable. When attached to the enclosure 102, the duct 124 may be placed adjacent to the vent 122 to direct the hot air 128 towards the stylus 112 when the stylus 112 is placed in the stylus holder 108. For example, the duct 124 may be made of plastic or any suitable material and may redirect hot air 128 exiting from the vent 122 toward the stylus holder 108. The hot air 128 may flow to the vent 122 through natural convection, directed using one or more fan(s) 126, directed using an internal duct, or other suitable ways. As used herein, natural convection is a type of flow, of motion of a liquid such as water or a gas such as air, in which the fluid motion is not generated by any external source (like a pump, fan, suction device, etc.) but by some parts of the fluid being heavier than other parts. The enclosure 102 may also include one or more fans 126 that are configured to direct the hot air 128 in the enclosure 102 towards the vent 122.

The hot air 128 exiting from the vent 122 of the enclosure 102 may heat the third location 118 of the stylus 112 to the third temperature. For example, when the stylus 112 is stored in the stylus holder 108, the third location 118 of the stylus 112 may be a portion of the outer surface of the stylus 112. The portion of the outer surface of the 112 may be adjacent to the vent 122 of the computing device 100 and may be heated to a third temperature by heat generated from the hot air 128 exiting from the computing device 100. As described above, the stylus 112 may have the fourth location 120 at the fourth temperature that is lower than the third temperature. The fourth location 120 of the stylus 112 may be cooled by exposing to an ambient environment through holes or another types of openings or a cooling channel. In this way, the stylus 112 may use the waste heat of the computing device 100 to generate electricity from a temperature difference between the third temperature and the fourth temperature and to charge one or more rechargeable batteries.

Thus, a computing device may include heat generating components that generate hot air internal to an enclosure of the computing device. The hot air may exit from one or more vents. A duct may be temporarily attached (e.g., to an edge of the enclosure of the computing device) over the vents to redirect the hot air exiting the one or more vents. When the stylus is not being used, the stylus may be temporarily stored adjacent to the enclosure using a stylus holder. The duct may redirect the hot air towards a portion of the stylus when the stylus is being stored in the stylus holder. The hot air may increase a temperature of a portion of the stylus while a remaining portion of the stylus may have a lower temperature (e.g., due to the remaining portion of the stylus being in contact with an ambient environment surrounding the enclosure). The stylus may include one or more thermoelectric generators (e.g., thermocouples) and one or more rechargeable batteries. The thermoelectric generators in the stylus may use the temperature differential between the first portion of the stylus (e.g., that is heated by the hot air) and the remaining portion of the stylus (e.g., which is at or near an ambient temperature) to generate electricity to charge the rechargeable batteries. For example, the user may use the computing device, causing the components located inside the enclosure to generate heat. After the user has completed using the stylus, the user may store the stylus in the stylus holder. The thermoelectric generators in the stylus may generate electricity based on the temperature differential between the first portion of the stylus (e.g., that is heated by the hot air) and the remaining portion of the stylus (e.g., which is at or near an ambient temperature) and charge the rechargeable batteries of the stylus. In this way, the batteries of the stylus may be charged after the user has completed using the stylus and has stored the stylus in the stylus holder. By charging the rechargeable batteries, the stylus may be used for a longer period of time (as compared to non-rechargeable batteries), thereby enhancing user satisfaction.

Figure 2:
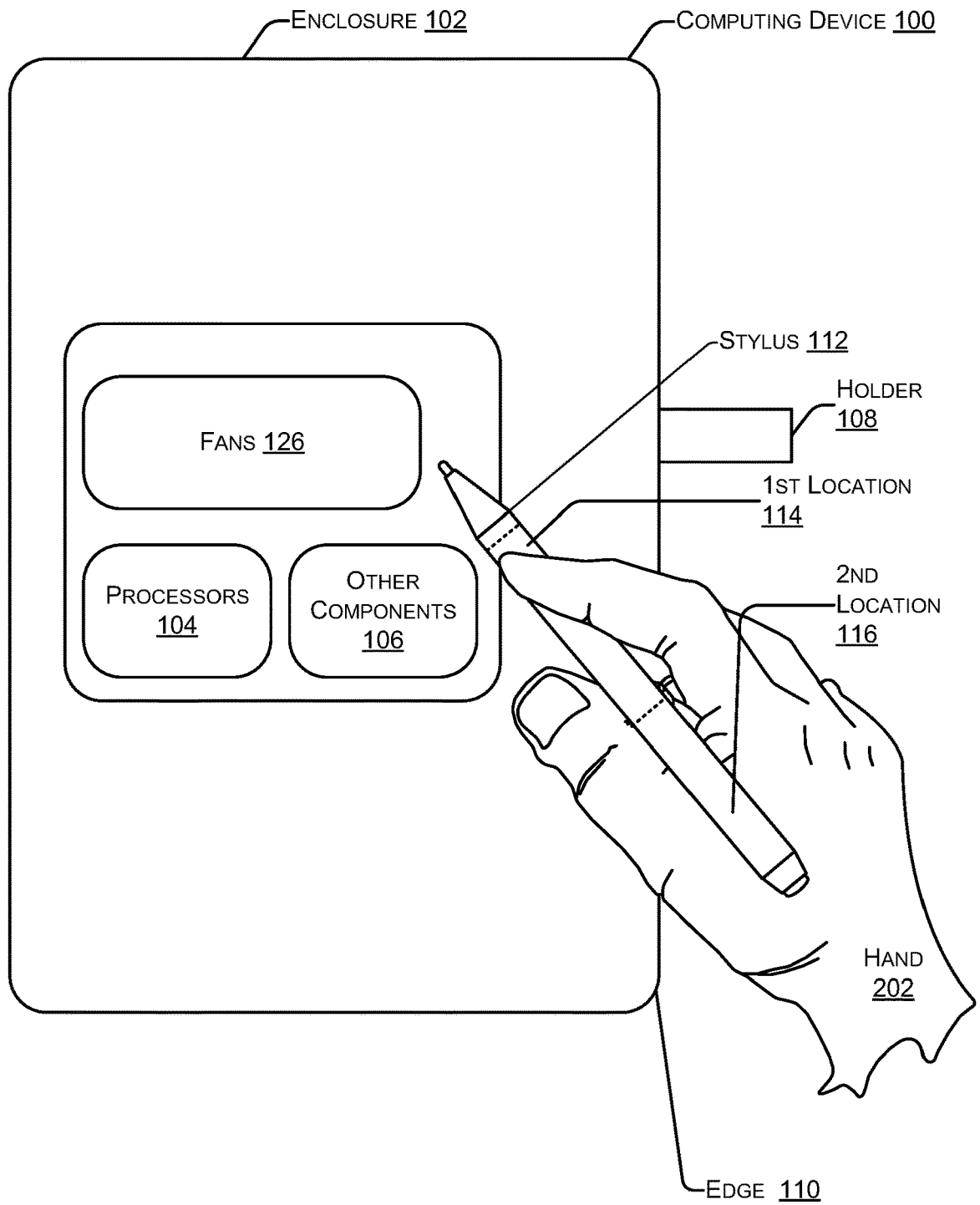
FIG. 2 is a diagram of a system that include a computing device and an associated stylus being charged when held in a hand of a user, according to some embodiments.

FIG. 2 is a diagram of a system 200 that include a computing device and an associated stylus being charged when held in a hand of a user, according to some embodiments. The system 200 includes the computing device 100 of FIG. 1. The computing device 100 may include the enclosure 102 that includes the processors 104 and other heat-generating components 106. The computing device 100 may be associated with the stylus 112. For example, the stylus 112 may store the electricity by recharging one or more rechargeable batteries in the stylus 112 when the stylus 112 is in contact with a user's hand 202, such as, for example, when the user is holding and manipulating the stylus 112 to interact with a touchscreen display of the computing device 100.

The stylus 112 may generate electricity when the stylus 112 is being held by the user's hand 202. The electricity may be generated by the stylus 112 based on a temperature difference between a first location 114 of the stylus 112 and a second location 116 of the stylus 112. The first location 114 may include portions of the stylus 112 that may be in touch with a user's hand 202. The first location 114 may be heated to a first temperature based on contact with the user's hand 202 at the first location 114. For example, the user's hand 202 may be holding the stylus 112 with the user's fingers touching the first location 114 of the stylus 112 to heat the first location 114. For example, the first location 114 may include a portion of an outer surface of the stylus 112. The portion of the outer surface may be selected based on which portion of the outer surface of the stylus 112 is in touch with the user's hand 202 when the user's hand 202 is holding the stylus 112. The first temperature at the first location 114 may be heated to a temperature at or near a body's normal temperature, such as 36.5-37.5° C., when the user's hand 202 is in touch with the stylus 112.

The second location 116 may have a second temperature that is lower than the first temperature. The second location 116 may include portions of the outer surface of the stylus 112 that are not in contact with the user's hand 202 and are therefore at a lower temperature than the first temperature. For example, the second location 116 may be exposed to the ambient environment (or may use a cooling channel) to cool the second location 116 to the second temperature. For example, the second temperature may be a temperature of an ambient environment, such as 18, 19, 20, 21, 22, 23, 24, 25, 26° C. or any temperature value or range derived therefrom. The stylus 112 may use the electricity generated by the temperature differential between the location 114, 116 to recharge one or more rechargeable batteries of the stylus 112 when the stylus 112 is in being held in the user's hand 202.

Thus, when a user is holding a stylus, the stylus may identify two portions of the stylus, e.g., a first portion of the stylus that is in touch with the user's hand and a second (e.g., a remaining) portion of the stylus that is not in touch with the user's hand. Heat from the user's hand may cause the first portion of the stylus to have a first temperature that is hotter than a second temperature of the second portion of the stylus. The stylus may include a thermoelectric generator (e.g., thermocouple) that uses the temperature difference between the first portion of the stylus and the second portion of the stylus to generate electricity to charge one or more rechargeable batteries of the stylus. In this way, the batteries powering the stylus may be charged during the time that a user is holding the stylus. By charging the rechargeable batteries, the stylus may be used for a longer period of time (as compared to non-rechargeable batteries), thereby enhancing user satisfaction.

Figure 3:
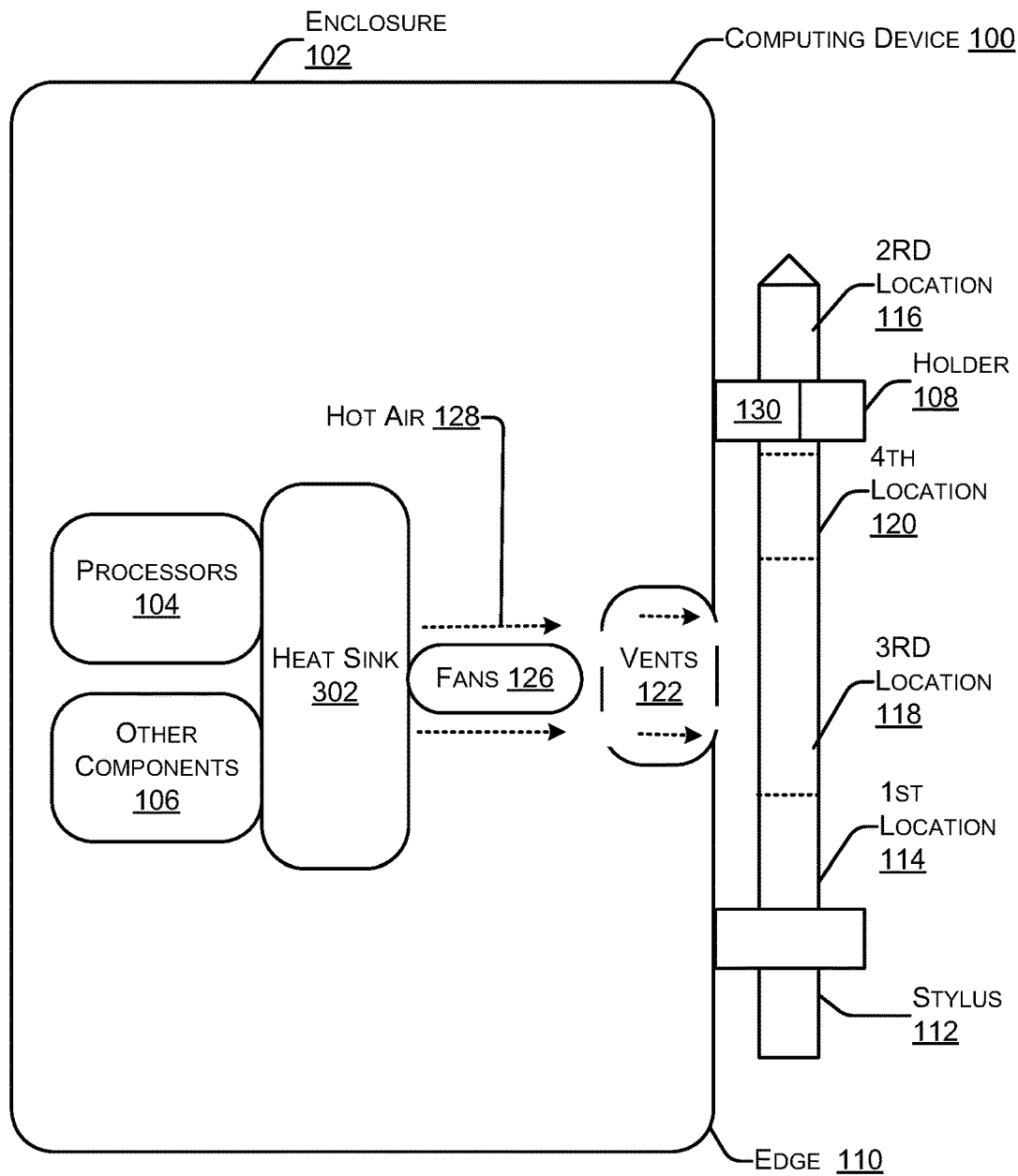
FIG. 3 is a block diagram of a system that includes a computing device directing hot air towards a stylus, according to some embodiments.

FIG. 3 is a block diagram of a system that includes a computing device directing hot air towards a stylus, according to some embodiments. As illustrated in FIG. 3, the computing device 100 may include an enclosure 102 that may include a plurality of components, such as one or more processors 104 (e.g., Central Processing unit (CPU)) and other heat-generating components 106. Other heat-generating components 106 may include, but not be limited to, one or more non-transitory computer-readable storage media (e.g., random-access memory (RAM)), graphics processing unit (GPU), digital signal processor (DSP), drive (e.g., hard drive, solid state drive (SSD), and other similar devices. The computer-readable storage media may be configured to store instructions executable by the one or more processors 104.

The computing device 100 may include a stylus holder 108 located on an edge 110 of the computing device 300, such as a side of the enclosure 102. The stylus holder 108 may hold a stylus 112 when the stylus 112 is not in use. The stylus 112 may be detachably stored in the stylus holder 108 when not in use, for example, through magnetic forces or other suitable methods. For example, the stylus 112 may have one or more magnets located in a barrel of the stylus 112 and the stylus holder 108 may have one or magnets having an opposite polarity to enable the stylus holder 108 to hold the stylus 112 in place using magnetic attraction of opposite polarities.

The stylus 112 may generate electricity when the stylus 112 is being stored in the stylus holder 108 outside the enclosure 102. The stylus 112 may generate electricity based on a temperature difference between a third location 118 and a fourth location 120 of the stylus 112. In some cases, when the stylus 112 is stored in the stylus holder 108, the third location 118 of the stylus 112 may be adjacent to the enclosure 102 of the computing device 100 and may be heated to a third temperature by heat generated from the plurality of components inside the enclosure 102 of the computing device 100. The fourth location 120 may be at a fourth temperature that is lower than the third temperature at the third location 118. The fourth location 120 may overlap or include the second location 116 in some implementations. The fourth location 120 may be part of the second location 116 in other implementations. In further aspects, the stylus 112 may further store the electricity by recharging one or more rechargeable batteries when the stylus 112 is not in use and is held in the stylus holder 108.

For example, during product design, a heat map may be generated to determine which portion of the outer surface areas of the enclosure 102 may create more heat than other portions of the outer surface areas. After determining this information, the stylus holder 108 may be located adjacent to the portion of the outer surface areas that is hotter than other portions of the outer surface areas to increase heat absorbed by the stylus 112 when the stylus 112 is stored in the stylus holder 108. As used herein, a heat map may be a graphical representation of data where the individual values contained in a matrix are represented as colors.

The stylus 112 may generate electricity from heat exiting from the computing device 100 when the stylus 112 is stored in the stylus holder 108 outside the enclosure 102. The plurality of components inside the enclosure 102 of the computing device 100 may generate heat to increase a temperature of air inside the enclosure 102 to create hot air 128.

The enclosure 102 may further include a vent 122 located on the edge 110 of the enclosure 102. The vent 122 may enable the hot air 128 created in the enclosure 102 to exit the enclosure 102 and be absorbed by the third location 118 of the stylus 112. The vent 322 may include one or more holes or another types of openings on the edge 110 of the enclosure 102.

The third location 118 of the stylus 112 may be adjacent to the vent 122 and may be heated to a third temperature when the stylus 112 is placed in the stylus holder 108 outside the enclosure 102. The enclosure 102 may also include one or more fan 126 that are configured to direct the hot air 128 in the enclosure 102 towards the vent 122.

In alternative embodiments, the enclosure 102 may further include a heat sink 302 located inside the enclosure 102. The heat sink 302 may help transfer the hot air 128 inside the enclosure 102 to the edge 110 of the computing device 100. The edge 110 may be adjacent to the third location 118 of the stylus 112 when the stylus 112 is stored in the stylus holder 108. The hot air 128 transferred by the heat sink 302 may emit heat through openings or through heat-conducting materials on the edge 110 and may heat the third location 118 of the stylus 112 when the stylus 112 is stored in the stylus holder 108 to create a temperature difference between a third temperature at the third location 118 and a fourth temperature at a fourth location 120 (e.g., the fourth temperature is lower than the third temperature).

In this way, a stylus such as the stylus 112 may use a thermoelectric generator such as one or more thermocouples to generate electricity based on a temperature difference between the third temperature and fourth temperature when the stylus 112 is being stored in the stylus holder 108 outside the enclosure 102. The temperature difference between the third temperature and fourth temperature may be created based on internally directed heat in the enclosure 102 through heat-transfer devices such as a heat sink 302.

As used herein, a heat sink is a device that transfers thermal energy from a higher temperature device (e.g., processors, non-transitory computer-readable storage media (e.g., random-access memory (RAM)), graphics processing unit (GPU), digital signal processor (DSP), drives (e.g., hard drives, solid state drives (SSD), and other similar devices)) to a lower temperature fluid medium (such as air). The heat sink 302 may be made of any heat conducting materials, including but not limited to aluminum, copper, silver, steel, any other heat conducting metal or alloy, any heat conducting polymer, or any combination thereof. The heat sink 302 may have a plurality of fins that extend from a base to increase surface areas of the heat sink 302. For example, the fins may be cylindrical, elliptical or square.

Thus, a computing device such as the computing device 100 may be associated with a stylus that enables a user to thermal charge the stylus when the user is using the stylus and also when the stylus is stored in a stylus holder outside of an enclosure of the computing device 300. The stylus may comprise one or more thermocouples that can convert heat from the user to electricity and recharge one or more rechargeable batteries. In addition, the stylus may comprise one or more thermocouples that convert the heat that has been directed internally, e.g., through a heat sink, in the enclosure to electricity and recharge one or more rechargeable batteries.

Thus, a computing device may include heat generating components that generate hot air internal to an enclosure of the computing device. The hot air may exit from one or more vents. When the stylus is not being used, the stylus may be temporarily stored adjacent to the enclosure using a stylus holder. The vents may direct the hot air towards a portion of the stylus when the stylus is being stored in the stylus holder. The hot air may increase a temperature of a portion of the stylus while a remaining portion of the stylus may have a lower temperature (e.g., due to the remaining portion of the stylus being in contact with an ambient environment surrounding the enclosure). The stylus may include one or more thermoelectric generators (e.g., thermocouples) and one or more rechargeable batteries. The thermoelectric generators in the stylus may use the temperature differential between the first portion of the stylus (e.g., that is heated by the hot air) and the remaining portion of the stylus (e.g., which is at or near an ambient temperature) to generate electricity to charge the rechargeable batteries. For example, the user may use the computing device, causing the components located inside the enclosure to generate heat. After the user has completed using the stylus, the user may store the stylus in the stylus holder. The thermoelectric generators in the stylus may generate electricity based on the temperature differential between the first portion of the stylus (e.g., that is heated by the hot air) and the remaining portion of the stylus (e.g., which is at or near an ambient temperature) and charge the rechargeable batteries of the stylus. In this way, the batteries of the stylus may be charged after the user has completed using the stylus and has stored the stylus in the stylus holder. By charging the rechargeable batteries, the stylus may be used for a longer period of time (as compared to non-rechargeable batteries), thereby enhancing user satisfaction.

Figure 4:
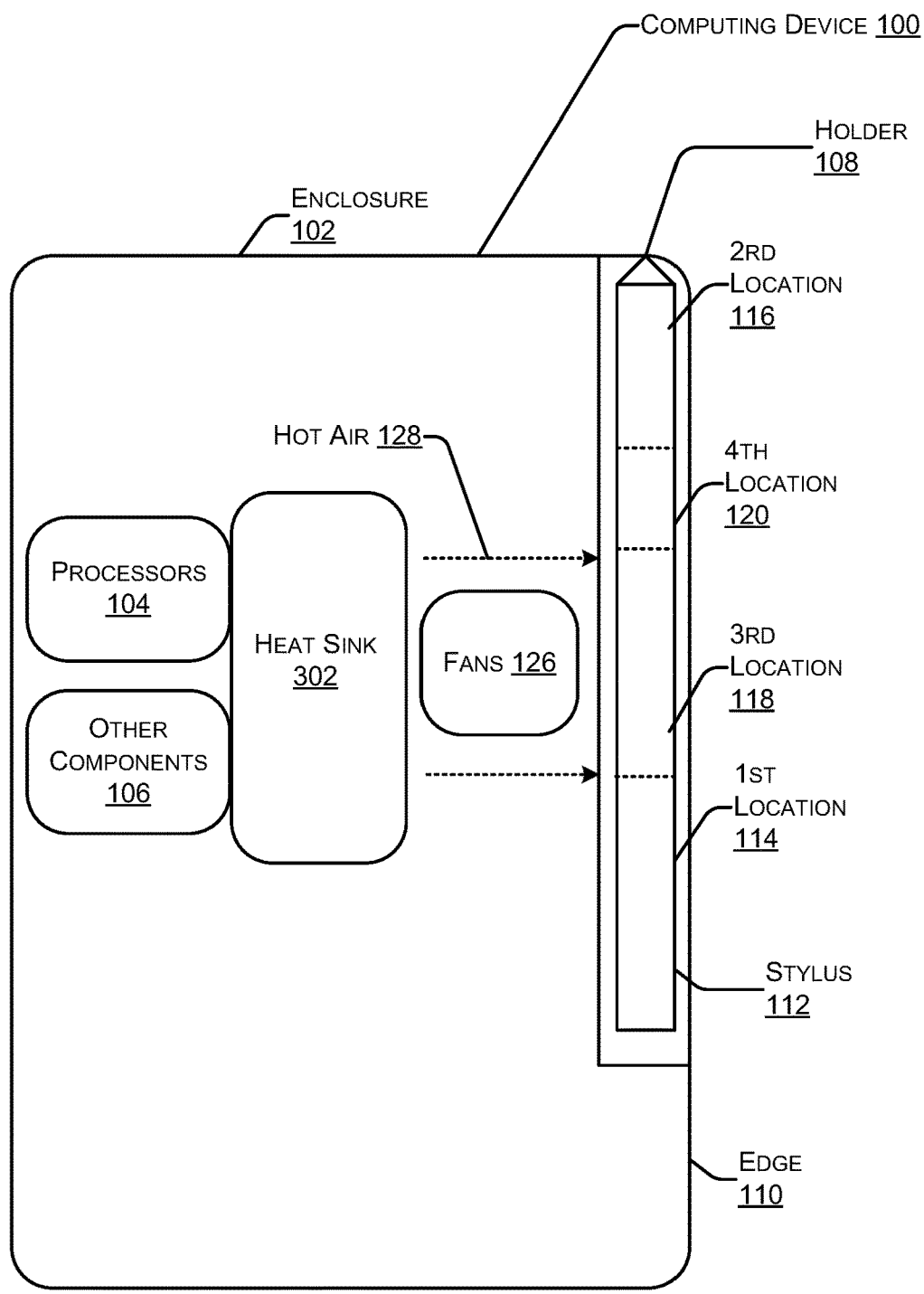
FIG. 4 is a block diagram of a system that includes a computing device having an internal cavity into which a stylus may be stored and recharged using heat generated inside the computing device, according to some embodiments.

FIG. 4 is a block diagram of a system that includes a computing device having an internal cavity into which a stylus may be stored and recharged using heat generated inside the computing device, according to some embodiments. As illustrated in FIG. 4, the computing device 100 may have the enclosure 102 that includes a plurality of components, such as one or more processors 104 (e.g., Central Processing unit (CPU)) and other heat-generating components 106. Other heat-generating components 106 may include, but not be limited to, one or more non-transitory computer-readable storage media (e.g., random-access memory (RAM)), graphics processing unit (GPU), digital signal processor (DSP), drives (e.g., hard drives, solid state drives (SSD), and other similar devices. The computer-readable storage media may be configured to store instructions executable by the one or more processors 104.

The computing device 100 may further include a stylus holder 108 inside the enclosure 102 of the computing device 100. For example, the stylus holder 108 may be an internal cavity of the enclosure 102. The stylus holder 108 may hold a stylus 112 when the stylus 112 is not in use. The stylus 112 may be stored in the stylus holder 108 when not in use, for example, through a magnetic force or other suitable methods. For example, the stylus 112 may have one or more magnets located in a barrel of the stylus 112 and the stylus holder 108 may have one or magnets having an opposite polarity to enable the stylus holder 108 to hold the stylus 112 in place using magnetic attraction of opposite polarities The stylus 112 may include one or more thermoelectric generators to generate electricity based on a temperature difference between the third location 118 of the stylus 112 and one or more of the other locations 114, 116, 120. The stylus 112 may generate electricity when the stylus 112 is being stored in the stylus holder 108 in the enclosure 102. The stylus 112 may generate electricity using one or more thermoelectric generators (e.g., thermocouples) based on a temperature difference between the third location 118 and one or more of the other locations 114, 116, 120. The third location 118 may be heated to a higher temperature by heat generated from the plurality of components of the computing device 100. The one or more of the other locations 114, 116, 120 may have a lower temperature compared to the third location 118. For example, in some cases, a cooling channel or other mechanism may be used to cool the locations 114, 116, 120. In this way, the stylus 112 may generate electricity to recharge one or more rechargeable batteries when the stylus 112 is placed in the stylus holder 108 inside the enclosure 102.

The stylus 112 may generate electricity from hot air 128 passed by a heat sink 302 when the stylus 112 is stored in the stylus holder 108 inside the enclosure 102. The plurality of components inside the enclosure 102 of the computing device 100 may generate heat to increase a temperature of air inside the enclosure 102 to create hot air 128. The enclosure 102 may further include a heat sink 302 located inside the enclosure 102. The heat sink 302 may be in contact with the stylus holder 108 or may be adjacent to the stylus holder 108. The heat sink 302 may help generate hot air 128 inside the enclosure 102 and transfer the hot air 128 to the third location 118 of the stylus 112 when the stylus 112 is stored in the stylus holder 108 inside the enclosure 102. The hot air 128 transferred by the heat sink 302 may heat the third location 118 of the stylus 112 when the stylus 112 is stored in the stylus holder 108 inside the enclosure 102 to create a temperature difference between a third temperature at the third location 118 and a fourth temperature at a fourth location 120 (e.g., the fourth temperature is lower than the third temperature). In this way, the stylus 112 may use a thermoelectric generator to generate electricity based on the temperature difference when the stylus 112 is being stored in the stylus holder 108 inside the enclosure 102.

As used herein, a heat sink is a device that transfers thermal energy from a higher temperature device (such as processors and memory) to a lower temperature fluid medium (such as air). The heat sink 302 may be made of any heat conducting materials, including but not limited to aluminum, copper, silver, steel, any other heat conducting metal or alloy, any heat conducting polymer, or any combination thereof. The heat sink 302 may have a plurality of fins that extend from a base to increase surface areas of the heat sink 302. For example, the fins may be cylindrical, elliptical or square.

Thus, a computing device may have an associated stylus. When the stylus is stored in an internal stylus holder of the computing device, the stylus may use one or more thermoelectric generators (e.g., thermocouples) to generate electricity to charge rechargeable batteries used to power the stylus. For example, the stylus may include one or more thermocouples to convert heat to electricity to recharge one or more rechargeable batteries when the stylus is stored in the stylus holder.

Figure 5:
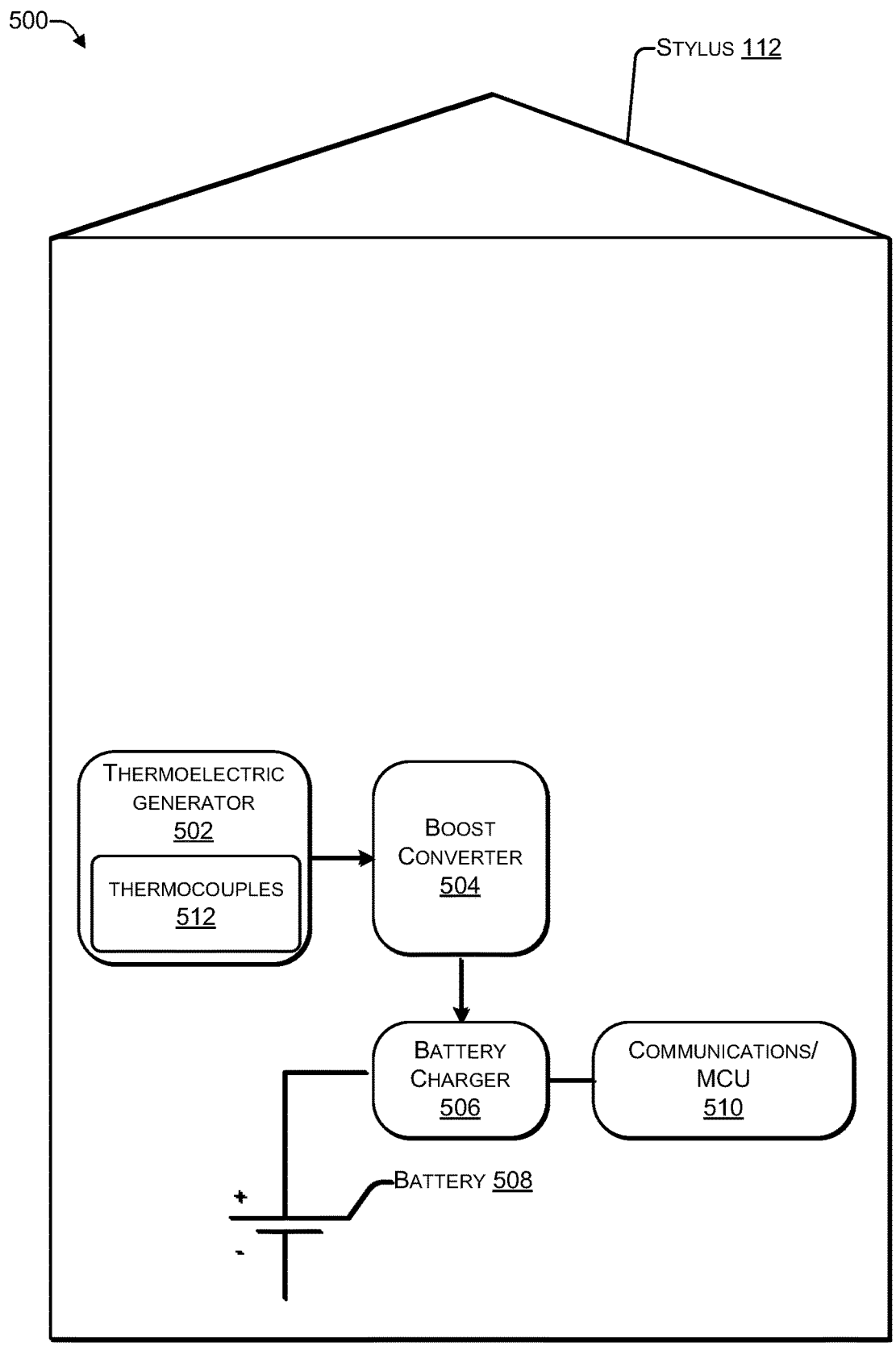
FIG. 5 is a block diagram of components of a stylus according to some embodiments.

FIG. 5 is a block diagram illustrating components of a stylus 112 according to some embodiments. One or more thermoelectric generators 502 may be in electrical communication with circuitry including a boost converter 504 and a battery charger 506 to recharge one or more rechargeable batteries 508. The battery charger 506 may be configured to be in electrical communication with a microcontroller unit 510. The one or more thermoelectric generators 502, the boost converter 504, the battery charger 506, the one or more rechargeable batteries 508, and the microcontroller unit 410 may be incorporated into the stylus 112 in FIGS. 1-4.

The thermoelectric generators 502 may be a solid state device (e.g., semiconductor electronics) that converts temperature differences directly into electrical energy through a phenomenon called the Seebeck effect (a form of thermoelectric effect). The Seebeck effect is the conversion of heat directly into electricity at the junction of different types of electrical conductors or semiconductors (e.g. metals). The thermoelectric generators 502 may include one or more thermocouples 512 which are each comprised of a pair of dissimilar thermoelectric materials (n-type and p-type) joined at one end. N-type and p-type, respectively, refers to the negative and positive types of charge carriers within the material. For example, the composition of the n-type thermoelectric materials may include the elements Bismuth (Bi), Tellurium (Te) and Selenium (Se). The composition of the p-type thermoelectric materials may include the elements Bismuth (Bi), Antimony (Sb) and Tellurium (Te). Thus, the stylus 112 may include the elements Bismuth (Bi), Tellurium (Te), Antimony (Sb), Selenium (Se), or any combination thereof.

As used herein, a thermocouple may refer to an electrical device including two dissimilar electrical conductors or semiconductors forming electrical junctions at differing temperatures. A thermocouple may produce a temperature-dependent voltage as a result of the thermoelectric effect, and this voltage may be used to recharge one or more rechargeable batteries as described herein. As used herein, a thermoelectric generator may be a solid state device (e.g., semiconductor electronics) that converts temperature differences directly into electrical energy through a phenomenon called the Seebeck effect (a form of thermoelectric effect). The Seebeck effect is the conversion of heat directly into electricity at the junction of different types of electrical conductors or semiconductors (e.g., metals).

The operating parameters of a thermoelectric generator may be mathematically characterized in several ways. For example, the voltage measured across unjoined ends of a thermocouple is directly proportional to the temperature difference across the two ends. When n-type thermoelectric legs and p-type thermoelectric legs that make up a thermocouple are electrically connected in series but thermally connected in parallel with a temperature difference $T_1$ and $T_2$ maintained thereacross, the open circuit voltage V under the Seebeck effect may be mathematically expressed by the following formula:

$V=S(T_1-T_2)$, where S is the Seebeck coefficient expressed in microvolts per degree (µV/K).

The efficiency of thermoelectric generators may be characterized by a thermoelectric figure of merit (Z), traditionally defined by the following formula:

$Z=S^2\sigma/K$, where $\sigma$ and $\kappa$ are the electrical conductivity and thermal conductivity, respectively. The figure of merit Z, expressed in reciprocal K, represents the thermal and electrical properties of a thermoelectric material that may be utilized in a thermoelectric generator. In some cases, thermoelectric generators may use highly effective thermoelectric films having low electrical resistance, high Seebeck coefficient and low thermal conductivity.

As a temperature difference is created and transmitted across the thermoelectric generator 502, electric current may be produced. For example, the heat produced and transmitted from a user in touch with the stylus or the heat produced and transmitted from the electronic device may convert to electric current by the thermoelectric generators 502.

The boost converter 504 may be in electrical communication with the thermoelectric generator 502 and may be used to increase the voltage from the thermoelectric generators 502 to the battery charger 506. As used herein, a boost converter (step-up converter) is a DC-to-DC power converter that steps up voltage (while stepping down current) from its input (supply) to its output (load). It is a class of switched-mode power supply (abbreviated as "SMPS") containing at least two semiconductors (a diode and a transistor) and at least one energy storage element: a capacitor, inductor, or the two in combination. To reduce power waste such as voltage ripple, filters made of capacitors (sometimes in combination with inductors) may be added to such a converter's output (load-side filter) and input (supply-side filter). For example, the boost converter 504 may be an ultra-low power boost converter (e.g., Texas Instruments bq25504).

The battery charger 506 may be in electrical communication with the boost converter 504 and may be used to charge one or more rechargeable batteries 508. As used herein, a battery charger, or recharger is a device used to put energy into a secondary cell or rechargeable battery by forcing an electric current through the secondary cell or rechargeable battery. Non-limiting chargers include a simple charger, a fast charger, an intelligent charger, a trickle charger, or the like.

The rechargeable batteries 508 may be in electrical communication with the battery charger 506 and may be recharged by the battery charger 506 with electrical energy generated from the thermoelectric generators 502. As used herein, a rechargeable battery, also known as a storage battery, secondary cell, or accumulator, is a type of electrical battery which can be charged, discharged into a load, and recharged many times, as opposed to a disposable or primary battery, which is supplied fully charged and discarded after use. The rechargeable batteries 508 may include one or more electrochemical cells. The term "accumulator" may be used as a device that accumulates and stores energy through a reversible electrochemical reaction. Rechargeable batteries may be produced in many different shapes and sizes, such as button cells. Several different combinations of electrode materials and electrolytes may be used, including, but not limited to, lead-acid, nickel-cadmium (NiCd), nickel-metal hydride (NiMH), lithium-ion (Li-ion), and lithium-ion polymer (Li-ion polymer).

The microcontroller unit 510 may be in electrical communication with the battery charger 506 and may be used to safely adjust the charging current and voltage, determine the state of charge, and control the charging process. As used herein, the microcontroller unit, also called MCU, may be a small computer on a single circuit. The microcontroller unit 510 may include one or more processors along with memory and programmable input/output peripherals. The microcontroller unit 510 may further include sensors or sensing circuits that may determine voltage or temperature of the charging process.

Thus, by a combination of using thermoelectric generators, boost converters, and battery chargers, and other suitable devices and techniques to facilitate thermal charging, the systems and techniques presented herein may allow efficient conversion of thermal energy to electricity in a stylus and recharge one or more rechargeable batteries in the stylus.

Figure 6:
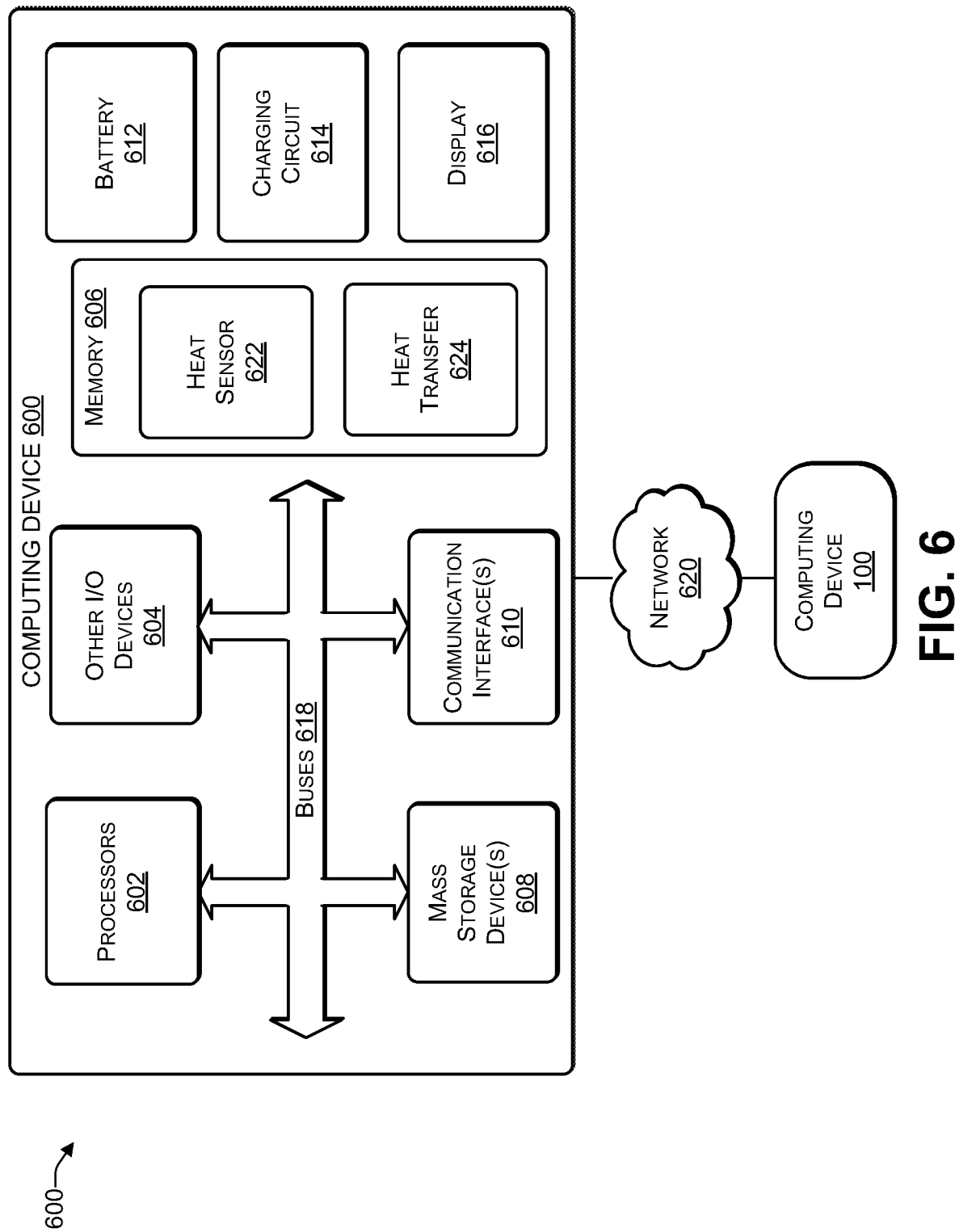
FIG. 6 illustrates a diagram of a computing device and a stylus according to some embodiments.

FIG. 6 illustrates an example configuration of a system 600 that can be used to implement the systems and techniques described herein according to some embodiments. For example, a computing device 600 may be used to implement the stylus 112, the computing device 100 or both, as illustrated in FIGS. 1-5. In FIG. 6, the computing device 600 may include one or more processors 602, other input/output (I/O) devices 604, a memory 606, mass storage device(s) 608, communication interface 610, one or more rechargeable batteries, a charging circuit, and a display device. These components may be configured to communicate with each other, such as via one or more system buses 618 or other suitable connections. While a single system bus is illustrated for ease of understanding, it should be understood that the system buses 618 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 602 are one or more hardware devices that may include a single processing unit or a number of processing units, all of which may include single or multiple computing units or multiple cores. The processors 602 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 602 may be configured to fetch and execute computer-readable instructions stored in the memory 606, mass storage device(s) 608, or other computer-readable media.

Memory 606 and mass storage device(s) 608 may be examples of computer storage media (e.g., memory storage devices) for storing instructions that can be executed by the processors 602 to perform the various functions described herein. For example, memory 606 may include both volatile memory and non-volatile memory (e.g., RAM, ROM, or the like) devices. Further, mass storage device(s) 608 may include hard disk drives, solid-state drives, removable media, including external and removable drives, memory cards, flash memory, floppy disks, optical disks (e.g., CD, DVD), a storage array, a network attached storage, a storage area network, or the like. Both memory 606 and mass storage device(s) 608 may be collectively referred to as memory or computer storage media herein, and may be any type of non-transitory media capable of storing computer-readable, processor-executable program instructions as computer program code that can be executed by the processors 602 as a particular machine configured for carrying out the operations and functions described in the implementations herein.

The computer storage media, such as memory 606 and mass storage device(s) 608, may be used to store software and data. For example, the computer storage media such as memory 606 may be used to store instructions that can be executed to generate heat maps, for example, by receiving and processing information from heat maps or heat sensors 622. The memory 605 may further be used to store instructions that can be executed to receive and process information related to heat transfer 624 in various heat-generating and heat-transfer components inside the computing device 600.

The computing device 600 may be used to implement the stylus 112 and may be connected to the computing device 100 by a network 620, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. The computing device 600 may include batteries 612, such as rechargeable batteries. The computing device 600 may further include a charging circuit 614 that may include a thermoelectric generator and a boost converter as described in FIG. 5. The computing device 600 may include a display 616 to display connection status to the computing device 600 and the batter level of the batteries 612, For example, the display 616 may be an LCD or LED display or any suitable displays.

Thus, systems and techniques provided herein may provide a solution for converting heat into electricity in a stylus associated with a computing device. Systems and techniques provided herein may recharge batteries in the stylus based on heat and obviate the need to manually check battery levels and remove and recharge batteries in the stylus.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A computing device comprising:
   an enclosure comprising:
      a plurality of components comprising:
         one or more processors; and
         one or more non-transitory computer-readable storage media to store instructions executable by the one or more processors;
      wherein the plurality of components generate heat to increase a temperature of air inside the enclosure to create hot air;
      a stylus holder located on an edge of the enclosure, the stylus holder to hold a stylus when the stylus is not in use;
      a stylus detachably stored in the stylus holder, the stylus comprising:
         one or more rechargeable batteries;
         one or more thermocouples to generate electricity to charge the one or more rechargeable batteries;
         wherein the one or more thermocouples generate the electricity when the stylus is being used based on a temperature difference between:
            a first location of the stylus that is heated to a first temperature by a user's fingers holding the stylus at the first location; and
            a second location of the stylus that is at a second temperature that is lower than the first temperature;
      a vent located on the edge of the enclosure, the vent enabling the hot air inside the enclosure to exit the enclosure; and
      a duct detachably placed adjacent to the vent to direct the hot air towards the stylus when the stylus is placed in the stylus holder to cause the stylus to generate the electricity to charge the one or more rechargeable batteries.

2. The computing device of claim 1, wherein the computing device further comprises a boost converter to:
   receive the electricity generated by the one or more thermocouples;
   step up a voltage of the electricity to create a stepped-up voltage; and
   output the stepped-up voltage to the one or more rechargeable batteries.

3. The computing device of claim 1, wherein the computing device comprises one of a laptop, a tablet, or a smartphone.

4. The computing device of claim 1, the enclosure further comprises a fan to direct the hot air towards the vent.

5. The computing device of claim 1, wherein a heat sink is attached to at least one component of the plurality of components, wherein one edge of the heat sink is positioned within a predetermined distance from the vent.

6. The computing device of claim 1, wherein the stylus comprise a third location that is heated to a third temperature by the hot air and a fourth location that is at a fourth temperature that is lower than the third temperature, and the thermocouples generate the electricity when the stylus is stored in the stylus holder based on a temperature difference between the third temperature and the fourth temperature.

7. The computing device of claim 1, further comprising a thermoelectric generator that includes the one or more thermocouples, wherein the thermoelectric generator is coupled to a battery charger to charge the one or more rechargeable batteries.

8. A computing device comprising an enclosure comprising:
   a plurality of components comprising:
      one or more processors; and
      one or more non-transitory computer-readable storage media to store instructions executable by the one or more processors;
   wherein:
      the plurality of components generate heat to increase a temperature of air inside the enclosure to create hot air; and
      a heat sink is attached to at least one component of the plurality of components;
   a stylus holder located inside the enclosure, the stylus holder to hold a stylus when the stylus is not in use, an edge of the heat sink positioned within a predetermined distance from the stylus holder;
   a stylus detachably stored in the stylus holder, the stylus comprising:

one or more rechargeable batteries;
one or more thermocouples to generate electricity to charge the one or more rechargeable batteries wherein the one or more thermocouples generate the electricity when the stylus is being used based on a temperature difference between:
 a first location of the stylus that are heated to a first temperature by a user's fingers holding the stylus at the first location; and
 a second location of the stylus that is at a second temperature that is lower than the first temperature;
a third location that is heated to a third temperature by the hot air; and
a fourth location that is at a fourth temperature that is lower than the third temperature, wherein the one or more thermocouples generate the electricity after the stylus is stored in the stylus holder based on a temperature difference between the third temperature and the fourth temperature.

9. The computing device of claim 8, wherein the computing device further comprises a boost converter to:
 receive the electricity generated by the one or more thermocouples;
 step up a voltage of the electricity to create a stepped-up voltage; and
 output the stepped-up voltage to the one or more rechargeable batteries.

10. The computing device of claim 8, wherein the enclosure further comprises a fan to direct the hot air towards the stylus holder.

11. The computing device of claim 8, wherein the computing device comprises one of a laptop, a tablet, or a smartphone.

12. The computing device of claim 8, further comprising a thermoelectric generator that includes the one or more thermocouples, wherein the thermoelectric generator is coupled to a battery charger to charge the one or more rechargeable batteries.

13. The computing device of claim 8, wherein the stylus is detachably held in the stylus holder by one or more magnets.

14. A mobile device comprising:
 an enclosure comprising:
  a plurality of components comprising:
   one or more processors; and
   one or more non-transitory computer-readable storage media to store instructions executable by the one or more processors;
  wherein the plurality of components generate heat to increase a temperature of air inside the enclosure to create hot air;
 a stylus holder located on an edge of the enclosure, the stylus holder to hold a stylus when the stylus is not in use;
 a stylus detachably stored in the stylus holder, the stylus comprising:
  one or more rechargeable batteries;
  one or more thermocouples to generate electricity to charge the one or more rechargeable batteries;
  wherein the one or more thermocouples generate electricity when the stylus is being used based on a temperature difference between:
   a first location of the stylus that is heated to a first temperature by a user's fingers holding the stylus at the first location; and
   a second location of the stylus that is at a second temperature that is lower than the first temperature;
 a vent located on the edge of the enclosure, the vent enabling the hot air to exit the enclosure; and
 a duct placed adjacent to the vent to direct the hot air towards the stylus after the stylus is placed in the stylus holder.

15. The mobile device of claim 14, wherein the duct is detachable from the enclosure.

16. The mobile device of claim 15, the stylus holder holds the stylus in place using a magnet.

17. The mobile device of claim 14, further comprising using a fan inside the enclosure to direct the hot air towards the vent.

18. The mobile device of claim 14, wherein a heat sink is attached to at least one component of the plurality of components, wherein one edge of the heat sink is positioned within a predetermined distance from the vent.

19. The mobile device of claim 14, wherein the stylus comprise a third location that is heated to a third temperature by the hot air and a fourth location that is at a fourth temperature that is lower than the third temperature, and the thermocouples generate the electricity when the stylus is stored in the stylus holder based on a temperature difference between the third temperature and the fourth temperature.

20. The mobile device of claim 14, further comprising generating a heat map of an outer surface of the enclosure and placing the stylus holder at a particular on the outer surface of the enclosure based at least in part on the heat map.

* * * * *